United States Patent [19]

Abnoosi et al.

[11] Patent Number: 5,027,256

[45] Date of Patent: Jun. 25, 1991

[54] COMPONENT CARRIER WITH CURVED BASE

[75] Inventors: Fatemeh Abnoosi, East Longmeadow; Robert L. Theroux, Halyoke, both of Mass.

[73] Assignee: K and M Electronics, Inc., West Springfield, Mass.

[21] Appl. No.: 437,976

[22] Filed: Nov. 16, 1989

[51] Int. Cl.$^5$ .............................................. H05K 7/06
[52] U.S. Cl. .................................. 361/417; 361/400; 336/65
[58] Field of Search ............. 361/380, 394, 398, 400, 361/401, 405, 406, 417, 419, 420; 336/65; 338/315; 248/371, 923; 439/55, 68, 70

[56] References Cited

U.S. PATENT DOCUMENTS

| 2,790,052 | 4/1957 | Armstrong | 338/315 |
| 4,890,085 | 12/1989 | Saito et al. | 336/192 |

FOREIGN PATENT DOCUMENTS

| 1043450 | 11/1958 | Fed. Rep. of Germany | 174/60 |
| 698519 | 10/1953 | United Kingdom | 336/65 |

Primary Examiner—Leo P. Picard
Assistant Examiner—Paramita Ghosh
Attorney, Agent, or Firm—Lahive & Cockfield

[57] ABSTRACT

Disclosed is a component carrier adapted for mounting components on curved surfaces. The carrier comprises a rigid base member having a top surface adapted for supporting a component and a bottom surface curved to mount flush to a complementary curved support surface.

2 Claims, 1 Drawing Sheet

5,027,256

COMPONENT CARRIER WITH CURVED BASE

BACKGROUND

This invention relates to component carriers. In particular it relates to component carriers adapted for mounting components on curved surfaces. One application where this invention is particularly useful is mounting transformers on curved circuit boards.

One method for constructing a transformer is to wind wire around an iron core. Another method is to wind the wire around the circumference of a doughnut shaped bobbin made of plastic acetal or like material and to then fasten an iron core in the center of the bobbin. Bobbin type transformers, also called modular transformers, are sometimes used for circuit board applications. Transformers used on circuit boards generally have very thin fragile winding leads.

Conventionally, bobbins for modular transformers have been integrally manufactured onto carriers. An advantage of mounting a transformer bobbin onto a carrier is that the fragile transformer winding leads can be affixed to the more sturdy carrier pins. In the prior art, such carriers are flat bottomed and are available for either surface mount or through-the-board mount applications. In some applications the carrier is designed to minimize component height by mounting flush to the circuit board.

Conventional transformer bobbins with integrally manufactured carriers are well suited for applications involving flat circuit boards. However, they are impractical to use on curved circuit boards, especially where it is critical to maintain the lowest possible component height. An example of such an application, requiring curved circuit boards and low component height is a toroidally shaped power supply that fits around a cylindrically shaped photo-multiplier tube.

In configurations where the circuit board is curved, a conventional modular transformer bobbin with flat bottom carrier will not mount flush to the board. Instead, only the opposed ends of the carrier base will abut the surface of the circuit board at points along the arc formed by the curved surface of the board. This causes the effective height of the transformer, measured from the surface of the circuit board to the point on the transformer furthest from the surface of the circuit board, to be greater than it would be if the same transformer were mounted on a flat circuit board. Moreover, conventional bobbin mounts cause excessive stress, particularly with relatively flexible circuit boards, at the points where the carrier intersects the surface of the board. Furthermore, conventional bobbin mounts also cause the carrier leads to be stressed as the circuit board is formed into its cylindrical shape.

One solution to this problem has been to mount transformer bobbins directly on the circuit boards, without carriers, for applications involving curved circuit boards where component height is critical. This approach, however, can be very costly. As mentioned above, the winding leads on unmounted transformers are very fragile and many are broken during testing. This causes considerable waste in both materials and labor. To avoid lead breakage, unmounted transformers are generally installed onto the circuit board and then tested in place. While this method avoids destroying transformers during testing, it also causes great waste. If a transformer proves to be defective after it is mounted to the circuit board, the entire circuit board must be discarded.

Accordingly, it is an object of the present invention to provide a rigid component carrier with a curved bottom adaptable for mounting components to concave curved surfaces.

It is a further objective to provide a carrier adaptable for use in applications involving curved circuit boards, particularly where component height is a critical factor.

Another object of this invention is to provide an improved carrier for supporting transformers on curved circuit boards in such a way that reduces the waste costs associated with testing those transformers.

Additionally, it is a object of this invention to eliminate both the problem of stressing the circuit board at the points where the bobbin carrier abuts the circuit board, and also the problem of stressing the carrier leads when the circuit board is formed into a cylindrical shape.

SUMMARY OF THE INVENTION

The present invention is a component carrier whose structure facilitates the mounting of components on concave curved surfaces while affording considerable savings in component height. A component carrier according to the invention is preferably comprised of a substantially electrically non-conductive, rigid material, such as plastic acetal. The carrier has a top surface adapted for supporting a component and a bottom surface curved to complement the surface to which the carrier is to be mounted. With this configuration, a structurally sound component mounting platform is established with a component-to-board spacing substantially less than that for a conventional rigid, relatively thin sheet-type mounting platform having comparable structural soundness.

In one form of the invention adapted for mounting electrical components on concave curved circuit boards, the carrier includes peripherally located through-holes for supporting electrically conductive, through-the-board type or surface mount type carrier leads. The latter configuration is particularly well adapted for mounting of electrical components, such as transformers, which have fragile leads that must be connected to printed circuit board lands. Those fragile leads may be connected to the relatively robust carrier leads which in turn are connected to the circuit boards lands. In this application, the invention reduces the waste costs associated with testing modular devices, particularly those meant for application on curved circuit boards and eliminates both the problem of stressing the circuit board, at the points where the carrier abuts the circuit board, and also the problem of stressing the carrier leads when the circuit board is formed into a cylindrical shape.

BRIEF DESCRIPTION OF THE DRAWINGS

The foregoing and other objects of this invention, the various features thereof, as well as the invention itself, may be more fully understood from the following description, together with the accompanying drawings in which.

DESCRIPTION OF THE PREFERRED EMBODIMENT

Figure 1:
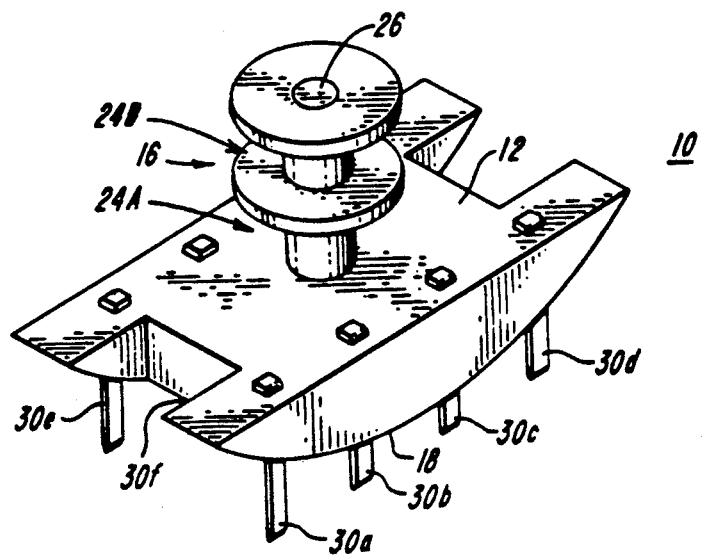
FIG. 1 is a perspective view of a curved bottom component carrier embodying features of the invention, adapted for supporting a transformer.
Figure 2:
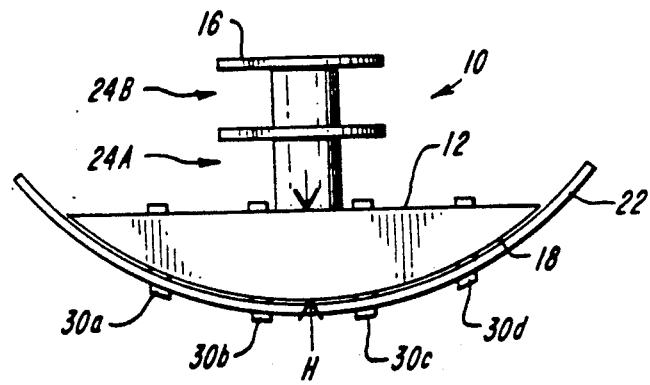
FIG. 2 shows a side elevation view of the carrier of FIG. 1, shown mounted on a concave curved circuit board.

An electrical circuit component carrier 10 embodying the invention is shown in FIG. 1 and FIG. 2. The carrier 10 is comprised of plastic acetal or other substantially electrically non-conductive rigid material. As described below, the carrier 10 is particularly adapted to provide a bobbin for a two-winding modular transformer although in alternative embodiments the invention is suitable for supporting many other types of components, such as resistors, diodes, capacitors, relays and a variety of integrated circuits.

In the preferred embodiment, the invention consists of a rigid component carrier member 12 having a top surface 14 having an integral bobbin 16 for a modular transformer, and having a bottom surface 18 convexly curved to mount flush on a complementary curved inner surface of a cylindrically shaped circuit board 22, as shown in FIG. 2. The bobbin 16 establishes two annular channels 24A and 24B extending about a central linear channel 26. In the transformer, when assembled, a first winding is positioned in the channel 24A and a second winding is positioned in an annular channel 24B and a high magnetic permeability core is positioned in a linear channel 26.

The carrier member 12 includes a set of pins (or leads) 30a–30h (leads 30g and 30h, not shown) extending from above, through and below respective ones of an array of holes located on the periphery of carrier 12. The lowermost portion of the leads are adapted to extend through a corresponding set of holes in the board 22 where those leads may be affixed (e.g. by soldering) to conductive strips (or lands on the lower surfaces of board 22, as shown in FIG. 2.

The upper most portions of the leads 30a–30h are adapted to affixed to the fragile leads from the windings disposed about the bobbin. The resultant composite transformer/carrier unit provides a relatively robust, modular package that may be readily tested prior to installation on the board 22. When installed, that composite unit is securely fastened to the concave curved board 22 in an optimal manner compared to modular transformers of the prior art.

Figure 3:
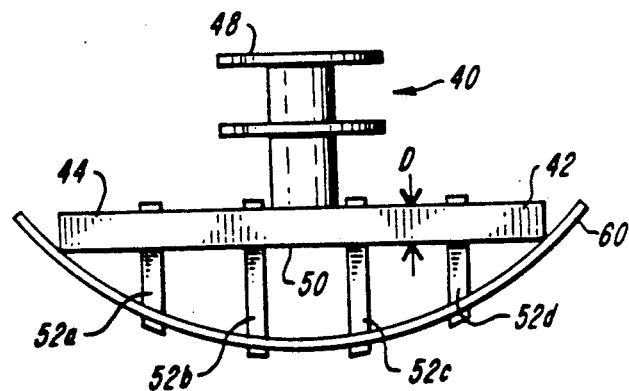
FIG. 3 shows a side elevation view of a prior art carrier, shown mounted on a concave curved circuit board.

A prior art electrical component carrier 40 is shown in FIG. 3 for comparison purposes. Carrier 40 includes a rigid, substantially uniform thickness, planar sheet member 42 having a top surface 44 adapted for supporting a transformer bobbin 48 and having a planar bottom surface 50. Prior art carrier 40 also includes throughholes which support through-the-board type leads 52a–52d for affixing the carrier (and electrically connecting a component mounted thereon) to a cylindrical circuit board 60.

Referring to FIG. 2 and FIG. 3, it can be seen that the present invention 10 is an improvement over the prior art 40. For comparison purposes, the carrier 10 of the invention and the carrier 40 of the prior art are illustrated in FIGS. 2 and 3 with the same lengths in the horizontal direction. In order to provide the prior art carrier with comparable structural rigidity to the carrier 12, the sheet member 42 has a thickness D. As a result, the top of bobbin 48 (or other component) on the carrier 40 is displaced from the board 60 by distance D greater than the top of the comparable sized bobbin 16 of the carrier 12 thus the carrier 10 of the present invention provides a rigid component carrier 12 with a curved bottom surface 18. Since bottom surface 18 mounts flush to curved circuit board 22, unlike the way prior art carrier 40 (with a planar bottom surface 50) mounts a corresponding circuit board 60. The component mounted on the carrier 12 permits a more efficient component packing density than does the carrier of the prior art.

Furthermore, since bottom surface 18 of carrier 12 mounts flush to circuit board 22, the carrier 12 is better able to support the mass of transformer bobbin 16 (and its associated windings and core, not shown). The carrier 12 may be made of less rigid material than carrier 40 since carrier 12 is rested fully within the curve of board 22. Due to this configuration, the carrier 12 may be made with a shorter horizontal dimension (relative to a comparable prior art carrier) and achieve the same structural support, resulting in a lower height (H) of carrier 12, further permitting components on carrier 12 to mount lower than components on an otherwise comparable prior art carrier.

As can be seen from FIG. 3, only the opposed ends of member 42 of the prior art carrier 40 abut circuit board 60. This causes relatively high stress to be placed on circuit board 60 at the points of contact. Making contact at only two points also causes the carrier leads 52a–52d to be relatively highly stressed when circuit board 60 is in its cylindrical configuration. In contrast by mounting flush to the curved circuit board 22, thereby evenly distributing the mechanical forces over the entire bottom surface of carrier 12, the carrier 12 of the present invention 10 avoids both of these problems.

The invention may be embodied in other specific forms without departing from the spirit or the essential characteristics thereof. The present embodiment is to be considered as illustrative and not restrictive. The scope of the invention is indicated by the appended claims, rather than by the foregoing description, and all changes which come within the meaning and range of equivalent of the claims are therefore intended to be embraced therein.

What is claimed is:

1. A component assembly comprising:
   A. a circuit board having a concavely curved component mounting surface.
   B. a component carrier including:
      i. a rigid base member having a top surface adapted for supporting a component, and
      ii. a bottom surface convexly curved to mount flush to said mounting surface of said circuit board,
      said base member including at lest one hole extending from said top surface to said bottom surface and at least one electrically conductive element extending through one of said holes and fixing said carrier to said circuit board with said bottom surface flush to said mounting surface, and electrically contacting said circuit board.

2. The component carrier of claim 1 wherein said component is a transformer.

* * * * *